(12) United States Patent
Gervais et al.

(10) Patent No.: US 7,949,499 B2
(45) Date of Patent: May 24, 2011

(54) FILTERING TECHNIQUES TO REMOVE NOISE FROM A PERIODIC SIGNAL AND IRMS CALCULATIONS

(75) Inventors: Michel Gervais, Bajamont (FR); Michael E. Moore, Central, SC (US); Isabelle B. Snyder, Walhalla, SC (US)

(73) Assignee: Itron, Inc., Liberty Lake, WA (US)

( * ) Notice: Subject to any disclaimer, the term of this patent is extended or adjusted under 35 U.S.C. 154(b) by 0 days.

(21) Appl. No.: 11/811,650

(22) Filed: Jun. 11, 2007

(65) Prior Publication Data
US 2008/0007247 A1    Jan. 10, 2008

Related U.S. Application Data

(60) Provisional application No. 60/813,139, filed on Jun. 13, 2006.

(51) Int. Cl.
*G01R 21/06* (2006.01)
(52) U.S. Cl. .............................. 702/191; 702/61; 702/69
(58) Field of Classification Search .................... 702/69, 702/88, 191
See application file for complete search history.

(56) References Cited

U.S. PATENT DOCUMENTS

| | | | |
|---|---|---|---|
| 4,885,722 A | 12/1989 | Leland | |
| 5,966,684 A * | 10/1999 | Richardson et al. | 702/191 |
| 6,018,364 A | 1/2000 | Mangelsdorf | |
| 6,320,920 B1 * | 11/2001 | Beyke | 375/350 |
| 6,330,275 B1 | 12/2001 | Bremer | |
| 6,476,743 B1 * | 11/2002 | Brown et al. | 341/123 |
| 6,493,644 B1 | 12/2002 | Jonker et al. | |
| 6,498,820 B1 | 12/2002 | Thomson et al. | |
| 6,516,279 B1 | 2/2003 | Jansen et al. | |
| 2006/0167640 A1 | 7/2006 | Tice | |

OTHER PUBLICATIONS

"Numerical-Integration Techniques Speed Dual-Slope A/D Conversion," Grandbois et al., Microchip AN788, © 2002, Microchip Technology, Inc.
Improvement of Spectral Resolution in the Presence of Periodic Noise and Microphonics for Hyper Germanium Detector Gamma-Ray Spectrometry Using a New Digital Filter, Schultz et al., ORTEC, Advanced Measurement Technology, Inc.
International Search Report for PCT International Application No. PCT/US07/13733 mailed Aug. 1, 2008.

* cited by examiner

*Primary Examiner* — Jonathan C. Teixeira Moffat
(74) *Attorney, Agent, or Firm* — Dority & Manning, P.A.

(57) ABSTRACT

A signal filtering technique is designed to remove the effects of a periodic, low-frequency noise signal from a signal of interest. A signal waveform is sampled at different points of a number of consecutive periodic noise signal cycles and the collected samples are averaged to produce a corrected signal. The number of consecutive cycles in which samples are taken and averaged is inversely related to the signal amplitude such that as the signal level decreases, the number of cycles examined increases. The technique is particularly applicable to periodic signals associated with the output of Hall effect sensors in an electrical metrology environment. Improved RMS calculations are obtained for filtering low-frequency random noise from Hall sensors by averaging samples at different points of a signal cycle to create a composite desired signal cycle to facilitate other signal calculations. In a given electricity utility meter incorporating solid state circuitry, such metrology RMS calculations may be implemented in a metrology section of solid state devices provided on printed circuit boards, such as utilizing programmable integrated circuit components. By varying the number of cycles summed, the algorithm will adapt to amplitude changes more quickly. By using time averaged samples to filter random noise from the periodic signal of interest, the overall requirements for complex filtering is reduced. Instead, the technique relies on buffering and averaging synchronized samples for a given number of line cycles, so that by increasing the buffer size, larger numbers of line cycles can be accumulated and the filter cut-off frequency reduced.

24 Claims, 3 Drawing Sheets

FILTERING TECHNIQUES TO REMOVE NOISE FROM A PERIODIC SIGNAL AND IRMS CALCULATIONS

PRIORITY CLAIM

This application claims the benefit of previously filed U.S. Provisional patent application entitled "FILTERING TECHNIQUES TO REMOVE NOISE FROM A PERIODIC SIGNAL AND Irms CALCULATIONS," assigned U.S. Ser. No. 60/813,139, filed Jun. 13, 2006, and which is fully incorporated herein by reference for all purposes.

FIELD OF THE INVENTION

The present technology relates to utility meters. More particularly, the present technology relates to methodologies and corresponding apparatus for filtering (i.e. removing) noise from periodic electrical signals, such as may be associated with electricity utility meters.

BACKGROUND OF THE INVENTION

The general object of metrology is to monitor one or more selected physical phenomena to permit a record of monitored events. Such basic purpose of metrology can be applied to a variety of metering devices used in a number of contexts. One broad area of measurement relates, for example, to utility meters. Such role may also specifically include, in such context, the monitoring of the consumption or production of a variety of forms of energy or other commodities, for example, including but not limited to, electricity, water, gas, or oil.

More particularly concerning electricity meters, mechanical forms of registers have been historically used for outputting accumulated electricity consumption data. Such an approach provided a relatively dependable field device, especially for the basic or relatively lower level task of simply monitoring accumulated kilowatt-hour consumption.

The foregoing basic mechanical form of register was typically limited in its mode of output, so that only a very basic or lower level metrology function was achieved. Subsequently, electronic forms of metrology devices began to be introduced, to permit relatively higher levels of monitoring, involving different forms and modes of data.

In the context of electricity meters specifically, for a variety of management and billing purposes, it has become desirable to obtain usage data beyond the basic kilowatt-hour consumption readings available with many electricity meters. For example, additional desired data may include rate of electricity consumption, or may include date and time of consumption (so-called "time of use" data). Solid state devices provided on printed circuit boards, for example, utilizing programmable integrated circuit components, have provided effective tools for implementing many of such higher level monitoring functions desired in the electricity meter context.

In addition to the beneficial introduction of electronic forms of metrology, a variety of electronic registers have been introduced with certain advantages. Still further, other forms of data output have been introduced and are beneficial for certain applications, including wired transmissions, data output via radio frequency transmission, pulse output of data, and telephone line connection via such as modems and/or wireless (such as cellular) linkups.

The advent of such variety and alternatives has often required utility companies to provide data collection mechanisms wherein appropriate data may be collected in environments that are increasingly hostile to such data collection. For example, electrical noise emanating from sources near electricity meter sensing functions may constitute a source of error in collected data. Any such errors may become more troublesome as the complexity of required or desired signal analysis increases.

Electricity meters typically include input circuitry for receiving voltage and current signals or levels at the electrical service. Input circuitry of whatever type or specific design for receiving the electrical service current signals is referred to herein generally as current acquisition circuitry, while input circuitry of whatever type or design for receiving the electrical service voltage signals is referred to herein generally as voltage acquisition circuitry. There are additional issues related to the measurement of voltage and current that present their own problems. One such problem relates to the dynamic range of the measured quantities during operation. Under more or less normal operational conditions, voltage will vary only over a relatively small dynamic range as the voltage range is controlled by the utility supplying the energy. Typically this range is +/−20% of the nominal voltage. For a 120 volt system, a measurement device is thus required to maintain accuracy over a range from 96 to 144 volts or over a dynamic range of 1.5:1.

Measurements of current, on the other hand, present a significantly different problem in that the current can vary widely depending on the loads being operated by the consumer, as well as depending, for example, on the time of day and/or the season of the year. Typical standards require that a measurement device maintain accuracy over a range of between 1.5-200 amps. Such relatively increased dynamic range (calculable in such example to 133:1) for current measurements makes the typical measurement of RMS current much more difficult than the measurement of RMS voltage.

Electricity meter input circuitry may be provided with capabilities of monitoring one or more phases, depending on whether monitoring is to be provided in either a single phase or a multiphase environment. Moreover, it is desirable that selectively configurable circuitry may be provided so as to enable the provision of new or alternative services or processing capabilities within an existing metering device. Such variations in desired monitoring environments or capabilities, however, lead to the requirement that a number of different metrology configurations be devised to accommodate the number of phases required or desired to be monitored or to provide alternative or additional processing capability within a utility meter.

As such, it is desired to provide a metrology technology that permits the collection of accurate data regardless of the environment in which the metrology device is installed and load under which the supply source operates, i.e., to provide a metrology device which is universally applicable with respect to environment.

While various aspects and alternative embodiments may be known in the field of utility metering, no one design has emerged that generally encompasses the above-referenced characteristics and other desirable features associated with utility metering technology as herein presented.

Various disclosures concern designs relating to signal noise reduction, including the following patents and articles: U.S. Pat. No. 6,498,820 B1 entitled Low Complexity Frequency Estimator And Interference Cancellation Method And Device by Thomson et al.; U.S. Pat. No. 6,330,275 B1 entitled Method And Apparatus For Overcoming Periodic Disturbances In Digital Subscriber Loops by Bremer; U.S. Pat. No. 6,018,364 entitled Correlated Double Sampling Method And Apparatus by Mangelsdorf; U.S. Pat. No. 5,966,684 entitled Method And Apparatus For Cancelling (sic) Periodic Electrical Interference by Richardson et al.; U.S. Pat. No. 4,885,722 entitled Method For Removing Low-Frequency Noise From Records With Data Impulse by Leland; "Numerical-Integration Techniques Speed Dual-Slope A/D Conversion," Grandbois et al., Microchip AN788, © 2002 Microchip Technology, Inc.; and "Improvement of Spectral Resolution in the Presence of Periodic Noise and Microphonics for Hyper Germanium Detector Gamma-Ray Spectrometry Using a New Digital Filter," Schultz et al., ORTEC, Advanced Measurement Technology, Inc. Sep. 29, 2004.

The disclosures of the foregoing United States patents and publications are for all purposes hereby fully incorporated into this application by reference thereto.

While various implementations of metrology devices have been developed and various noise filtering techniques have been developed, no design has emerged that generally encompasses all of the desired characteristics as hereafter presented in accordance with the subject technology.

SUMMARY OF THE INVENTION

In view of the recognized features encountered in the prior art and addressed by the present subject matter, an improved apparatus and corresponding methodology for filtering noise from collected data signals has been provided.

In a broader present object, signal filtering methodology and corresponding apparatus are provided for reducing or removing the effect of random noise from periodic signals of interest.

In one of its simpler forms, the present technology advantageously provides filtering of a wide spectrum of signal noise content from a signal of interest.

Another advantageous aspect of the present signal filtering subject matter is that it may be provided by sampling a periodic signal waveform at different points of a number of consecutive periodic signal cycles and averaging the collected samples to produce a corrected signal.

Yet another more specific object of the present signal filtering is that the number of consecutive cycles in which samples are taken and averaged may in certain present embodiments be selected so as to be inversely related to the noise signal amplitude, such that as the noise signal level decreases, the number of cycles examined increases, to thereby provide a more accurate signal.

Another present object of the subject signal filtering is that while it generally only applies to wide frequency band of noise signals with use generally in association with specific sensor types, the technique may, nonetheless, be applied to any signal where a random noise signal is otherwise present in a periodic signal of interest.

Additional objects and advantages of the present subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents including combinations of features, parts, or steps or configurations thereof not expressly shown in the figures or stated in the detailed description of such figures.

One present exemplary embodiment relates to a metering apparatus including signal filtering to remove or reduce random noise from a signal or signals of interest. Such exemplary embodiment preferably includes at least one sensor for providing at least one initial signal output; and solid state circuitry for receiving such at least one initial signal output of such at least one sensor, sampling such at least one initial signal output at different respective points of a predetermined number of consecutive periodic signal cycles thereof, and averaging such respective point samples to produce a sum signal to evaluate waveform characteristics of such sum signal. Advantageously per such exemplary embodiment, such sum signal has reduced random noise relative to such at least one initial signal output.

In further alternatives of the foregoing, such solid state circuitry may in certain instances be operative so that such predetermined number of consecutive cycles sampled increases with a decrease in signal amplitude of such at least one initial signal output. Also, in further such alternatives, sensors may be variously provided in plural and configured for use in multi phase systems. Still further in various present alternatives, sensors may variously be configured for monitoring the consumption or production of a variety of forms of energy or other commodities, such as at least one of electricity, water, gas, and oil.

In another present exemplary embodiment, an electricity meter may be provided with improved filtering of random noise, and preferably include Hall effect sensors for sensing at least one of current and voltage signals, and providing at least one initial signal output; and a metrology board for receiving such at least one initial signal output of such Hall effect sensors, sampling such at least one initial signal output at different respective points of a predetermined number of consecutive periodic signal cycles thereof, and averaging such respective point samples to produce a sum signal for processing RMS calculations based on such sum signal, whereby such sum signal has reduced low-frequency random noise relative to such at least one initial signal output. In certain alternative embodiments thereof, such metrology board may preferably include a buffer for storing such respective point samples of such predetermined number of consecutive cycles sampled from such at least one initial signal output. In other present alternatives, such Hall effect sensors may be configured for use in multi phase systems, and/or be operative for sensing current signals, with such metrology board operative for synchronously sampling such sensed current signals at different respective points of consecutive periodic signal cycles thereof.

In yet another present exemplary embodiment, an electronic electricity meter may be provided, preferably comprising input circuitry for receiving from a supply source electrical service signals to be metered, including current acquisition circuitry for outputting electrical service current signals therefrom, and voltage acquisition circuitry for outputting electrical service voltage signals therefrom. Such meter further preferably includes a metrology board for receiving such electrical service voltage signals and such electrical service current signals, synchronously sampling such signals at different respective points of a predetermined number of consecutive periodic signal cycles thereof, and averaging such respective point samples to produce corrected signals on which RMS calculations are based. Still further such predetermined number of consecutive periodic signal cycles may be inverse to the amplitude of such signals, whereby such corrected signals have reduced low-frequency random noise relative to such electrical service signals, for improved accuracy metering regardless of the environment in which the electricity meter is installed and regardless of the load under which the supply source for the input circuitry operates.

In alternatives of the foregoing electronic electricity meter, such current acquisition circuitry and voltage acquisition circuitry may be configured for use in multi phase systems. Still further, such metrology board may advantageously include a buffer for storing such respective point samples of such predetermined number of consecutive cycles sampled from such signals. In further alternatives, such metrology board may be operative for synchronously sampling electrical service current signals at different respective points of consecutive periodic signal cycles thereof, the frequency of which respective points per signal cycle is an integer multiple of the line frequency of the supply source in which said electricity meter is installed.

It is to be understood that the present subject matter equally relates to corresponding methodology. An exemplary such present methodology relates to signal filtering to remove the effects of a periodic, low-frequency noise signal from a signal of interest. Such exemplary methodology may comprise sampling a signal waveform of an initial signal of interest at different respective points of a number of consecutive periodic noise signal cycles; and thereafter averaging the collected samples of different respective points to produce a corrected signal of interest.

In still further alternatives of the foregoing exemplary methodology (forming further exemplary present methodologies), the number of consecutive cycles in which respective samples are taken and averaged may be predetermined. Also, in other alternatives, such predetermined number of consecutive cycles in which respective samples are taken and averaged may be inversely related to the amplitude of the initial signal of interest such that as such signal amplitude level decreases, the number of cycles examined increases.

In other present methodologies, the initial signal of interest may be the output of Hall effect sensors in an electrical metrology environment, and/or with such Hall effect sensors operative in an electricity meter, so that the methodology may further include using such corrected signal of interest for RMS calculations. Other alternatives may include practice of the present basic methodology with an initial signal of interest is an internal signal in a metrology environment, with the resulting corrected signal of interest evaluated for waveform characteristics thereof with random noise reduced therefrom by such signal filtering. When used in a metrology environment, it may include the monitoring of the consumption or production of a variety of forms of energy or other commodities, such as at least one of electricity, water, gas, and oil.

Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
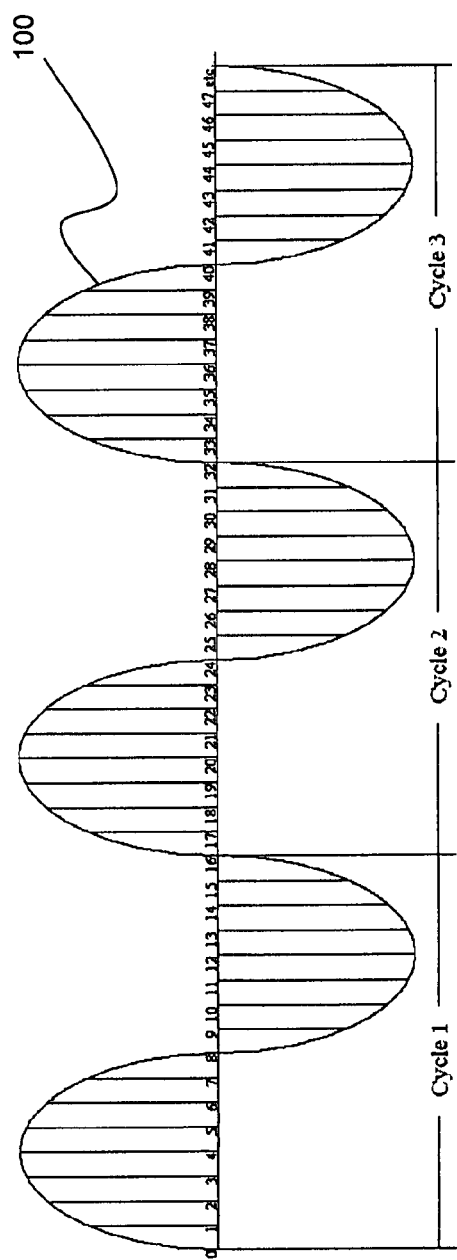
FIG. 1 illustrates synchronous sampling of consecutive cycles of a periodic waveform.

Repeat use of reference characters throughout the present specification and appended drawings is intended to represent same or analogous features, elements, or steps of the present subject matter.

DETAILED DESCRIPTION OF THE PREFERRED EMBODIMENTS

As discussed in the Summary of the Invention section, the present subject matter is particularly concerned with corresponding methodology and apparatus for reducing or eliminating random noise from a signal or signals of interest and, in particular, a signal such as may be used to calculate RMS values for a measured quantity, and, also in particular, a periodic signal of interest.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Moreover, it should be appreciated that, whereas the general discussion herein relates more specifically to electricity meters and specific sensor types including Hall effect sensors, such is not a limitation of the present technology. In general the present technology may be applied to any form of signal processing where elimination or reduction of random noise from a periodic signal or periodic signals of interest may be desirable.

Reference will now be made in detail to the presently preferred embodiments of the subject corresponding methodology and apparatus for improving RMS calculations by filtering random noise. Referring now to the drawings, FIG. 1 illustrates a sequence of three consecutive cycles denoted for present exemplary purposes as Cycle 1, Cycle 2, and Cycle 3 of a sampled waveform generally 100. In the present exemplary embodiment, the waveform may correspond to a monitored current signal in an electrical circuit. It should be appreciated that while the illustration in FIG. 1 may be more representative of a single phase system, such is exemplary only, inasmuch as the present technology may also be applied to plural or multi phase systems.

With further reference to FIG. 1, it will be seen that the three illustrated cycles have been illustrated as having been sampled synchronously. In such exemplary embodiment, the illustrated cycles have been sampled sixteen times each such that Cycle 1 is assigned samples 0-15 (i.e., samples 0 through 15, etc.), Cycle 2 is assigned samples 16-31, and Cycle 3 is assigned samples 32-47. In accordance with the present technology, samples of a current waveform are taken at a frequency which is an integer multiple of the line frequency of the system in which the measurement apparatus is utilized. Thus, it is contemplated that while the present exemplary embodiment employees sixteen samples per cycle, varying numbers of samples may be taken per cycle in any particular implementation of the present technology (in accordance with the present disclosure) while the number of samples per cycle will remain constant in any one implementation.

While one aspect of the present technology is to improve measurement accuracy over a wide dynamic range of measured current values, the sampling points are advantageously configured so as to be dependent on the line frequency as represented by the system voltage. One of the present advantages of such a selection of system voltage line frequency is rooted in the fact presently noted above—i.e., that the dynamic range of voltage values in a system is significantly less than that of current values since such dynamic range of voltage values depends primarily on the supplying utility. Accurate sampling points may, therefore, be obtained in accordance with one aspect of the present subject matter by employing a frequency locked loop (FLL) locked to the voltage waveform, to provide accurate measurement of the selected integer number of samples of the current waveform to be taken.

As previously pointed out, one of the issues involved with prior RMS calculation methodologies involves the undesirable inclusion of signal noise, resulting in inaccurate calculations. The present technology address this issue by realizing that random noise of the type that produces significant portions of the calculation error results from noise that has an average value of zero. Given such a presently disclosed understanding of the noise source, the present technology takes advantage of such characterization of the noise by averaging samples from several cycles together to obtain a composite value that may be used in previously employed calculations to produce a noise free result.

One of the problems with the classic RMS calculation methodology is that noise is squared along with the signal or signals of interest, and thereby produces errors in the RMS calculation. The traditional RMS calculation stipulates that:

$$RMS = \sqrt{\frac{1}{X} * \sum_{n=0}^{X} i^2(n)}$$

where $i(n)$=Individual_Sample_Taken_at_Time_$n$

The present technology (encompassing both apparatus and corresponding methodology) provides a filtered value for the individual samples that effectively removes the noise component before the filtered sample values are used to calculate the RMS value for the monitored waveform.

Figure 2:
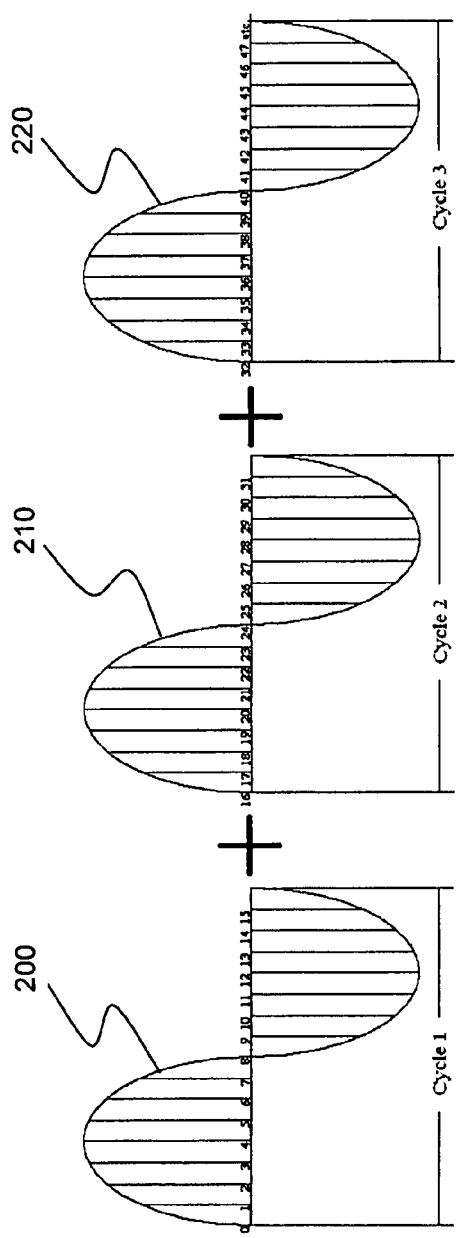
FIG. 2 illustrates a segmented consecutive cycle sampling methodology in accordance with the present technology.

With reference now to FIG. 2, there is illustrated an exemplary sequence of three sampled cycles 200, 210, 220 that correspond to the three cycle waveform generally 100 illustrated in FIG. 1. As represented in FIG. 2, the individual sample values from the three cycles 200, 210, 220 are to be added together to produce, as illustrated in FIG. 3, a composite or summed waveform generally 300.

Figure 3:
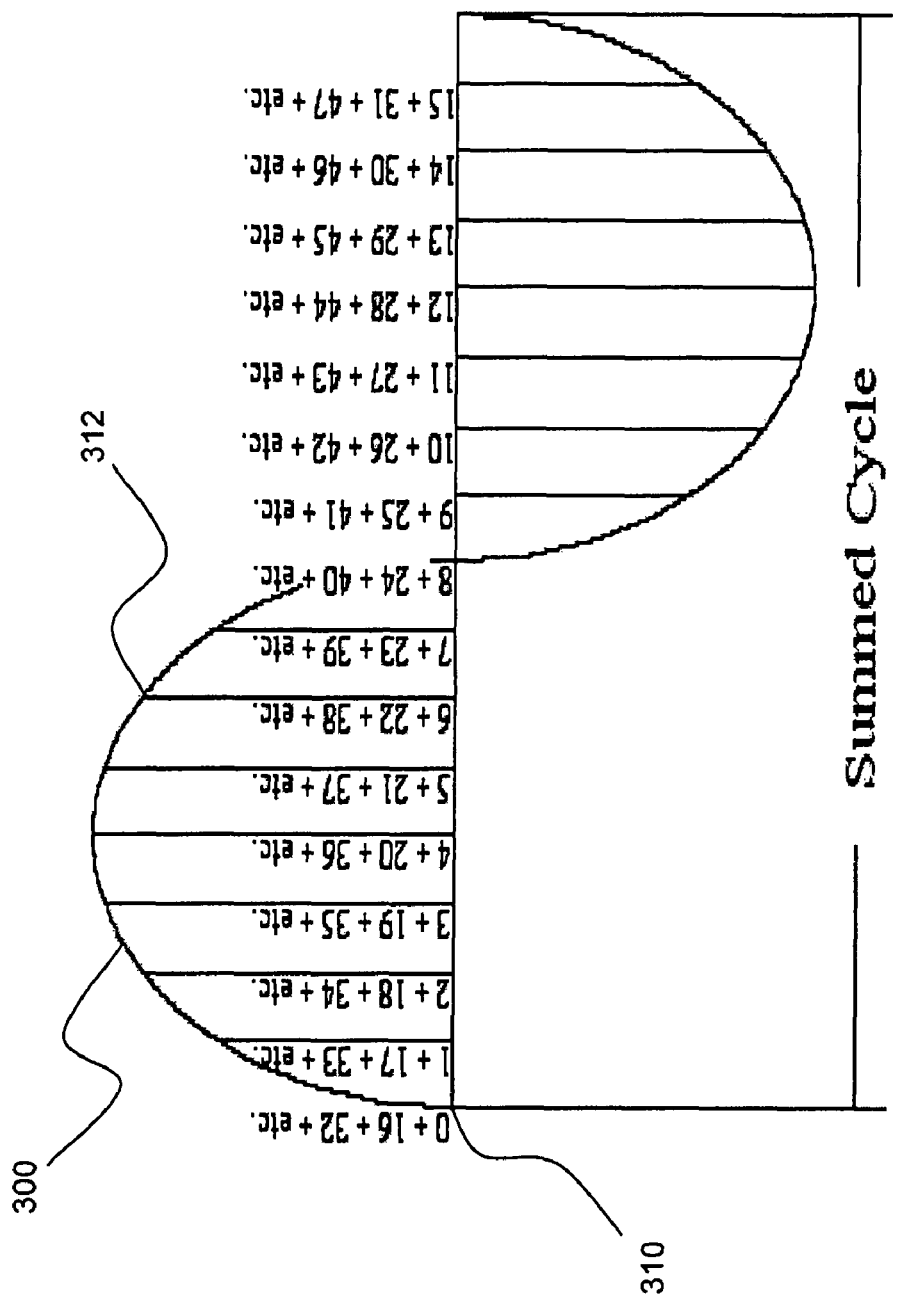
FIG. 3 illustrates a composite of plural, consecutively sampled cycles, the values of which may be used in accordance with the present technology to remove periodic noise from an RMS calculation.

With reference to FIG. 3, it will be observed that the 16 individual sample points on the summed cycle 300 correspond in value to the summed values of matching sample points from cycles 200, 210, 220 illustrated in present exemplary FIG. 2. Thus, in accordance with the present subject matter, a first sample point 310 on summed waveform 300 corresponds to the sum of the values from sample "0" from Cycle 1 plus the value from sample "16" from Cycle 2 and the value from sample "32" from Cycle 3. Similarly, a second sample point 312 on summed waveform 300 corresponds to the sum of the values from sample "6" from Cycle 1 plus the value from sample "22" from Cycle 2 and the value from sample "38" from Cycle 3. The remaining fourteen samples on summed cycle 300 may be similarly obtained, in accordance with the present subject matter.

In general, the equations per the present subject matter, for the represented present example for the summed cycle generally 300 are:

$i(n)=i(n)+I(n+\text{Number\_of\_Samples\_per\_cycle}+i(n+2*\text{Number\_of\_Samples\_per\_cycle})$ so that, for example, with n=16, i.e. 16 samples per cycle:

$i(0)=i(0)+i(16)+i(32)+\text{etc.}$ $i(1)=i(1)+i(17)+i(33)+\text{etc.}$

Following summation of the selected number of samples from the summed samples, a traditional RMS calculation using the averaged samples may be conducted as:

$$RMS = \sqrt{\frac{1}{X} * \sum_{n=0}^{X} \left(\frac{i(n)}{Y}\right)^2}$$

where

X=Number_of_Samples_per_Cycle

Y=Number_of_Summed_Cycles.

In the forgoing exemplary configuration of the present technology, the number of samples per cycle, X in the above equation, was set at 16 while the number of summed cycles Y was set at 3. Both of these values may be changed in accordance with the present technology. In particular, the value Y designating the number of summed cycles may be varied dynamically depending on the amplitude of the measured signal. By varying the number of cycles summed in accordance with the present subject matter, the algorithm is more quickly adapted to amplitude changes. By using time averaged samples to filter random noise from the signal or signals of interest, the methodology of the present technology reduces the overall requirements for complex filtering and only relies on buffering and averaging synchronized samples for a given number of line cycles. By increasing the buffer size, larger numbers of line cycles can be accumulated and therefore reduce the filter cut-off frequency. In such manner, most of the low frequency content of the noise can be reduced.

Figure 4:
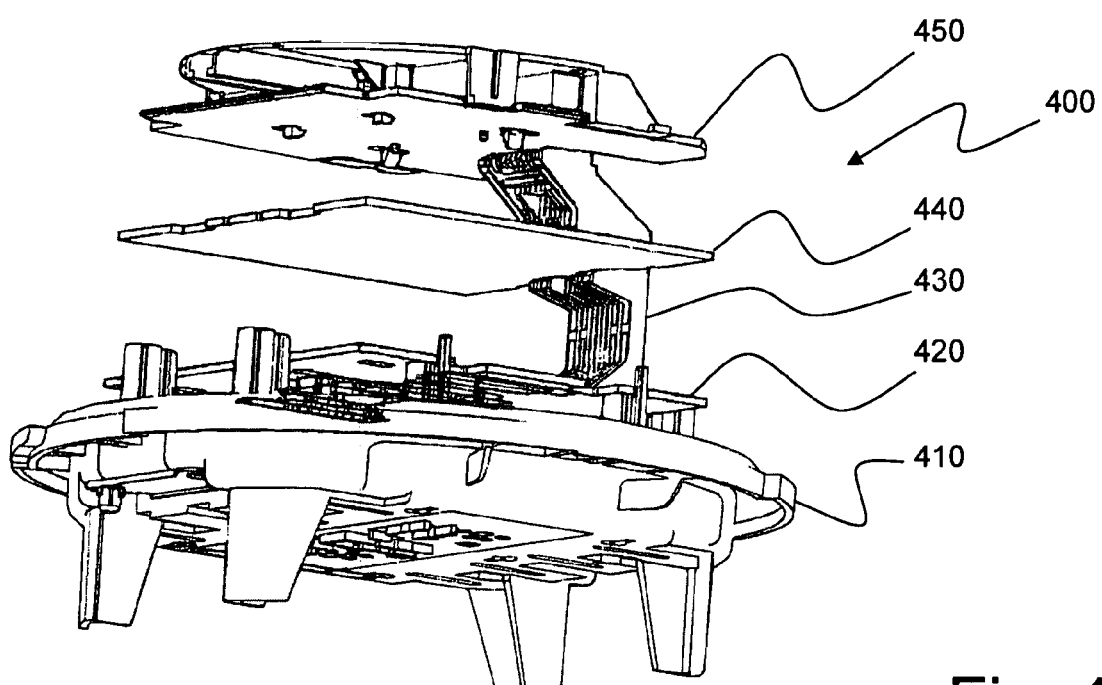
FIG. 4 is a generally side and bottom isometric view of an exemplary utility meter employing plural respective circuit boards which may be integrated into an implementation in accordance with the present subject matter.

With reference to FIG. 4, there are illustrated generally side and bottom isometric views of an exemplary utility meter 400 incorporating solid state circuitry which in turn may variously incorporate the present subject matter with reference to metrology RMS calculations. Solid state devices provided on printed circuit boards, such as utilizing programmable integrated circuit components or the like, may be used for example, for implementing the present metrology RMS calculations otherwise discussed in the present specification. While a specific present example of such is illustrated, which happens to use three different circuit boards, it is to be understood by those of ordinary skill in the art that the present subject matter may be practiced in a wide variety of alternative configurations, such as involving other numbers of circuit boards and/or interconnections thereof. All such variations are intended to come within the scope of the present subject matter, as those of ordinary skill in the art will understand other general aspects of electricity meters into which the present subject matter may be incorporated, which general aspects form no particular part of the present subject matter.

In the present example represented in FIG. 4, exemplary utility meter 400 includes a base member 410 to which may be attached a printed circuit board (PCB) 420 that may correspond to, for example, a Metrology Printed Wiring Board (PWB). In general, the present subject matter would preferably be implemented in calculations to be conducted in such metrology section/functionality of the meter, based on inputs thereto otherwise derived from association of the meter with an installation (details of which are well known to those of ordinary skill in the art, and not otherwise shown herewith as they form no particular aspect of the present subject matter). A connector generally 430 is represented as such may be attached to connector traces on an edge portion of PCB 420. In a similar manner, other associated boards of electricity meter 400 may be implemented as shown, or they may be implemented in some other fashion, details of which form no particular present aspect. For example, such as an Options Printed Wiring Board corresponding to a PCB 440 may be plugged into a corresponding slot of the representative connector 430. Still further by way of example only, a representative Register Printed Wiring Board corresponding to PCB 450 may be plugged into another representative slot of the exemplary connector 430.

As represented, each of the several slot positions of exemplary connector 430 may provide electrical connections and/or support for the PCB plugged into the slots, and via such electrical connections through which data and/or circuit board power may be conducted among the three exemplary boards as desired in a given embodiment. The exemplary utility meter generally 400, once assembled, may be protected by placement of a cover (such as made of glass or Plexiglas—not shown but well known to those of ordinary skill in the art) over the various circuit boards (regardless of the number used), and into sealing engagement with the utility meter base 410 (also as well understood in the art).

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. Metering apparatus including signal filtering to remove or reduce random noise from a signal or signals of interest, comprising:
    at least one sensor for providing at least one initial signal output;
    solid state circuitry for receiving said at least one initial signal output of said at least one sensor, synchronously sampling said at least one initial signal output at different respective points of a predetermined number of consecutive periodic signal cycles thereof such that the frequency of said respective points per cycle is a constant integer multiple of the frequency of the at least one initial signal output, summing such respective point samples to produce a composite signal, said composite signal comprising sample points corresponding in value to summed values of matching respective point samples of said predetermined number of consecutive periodic signal cycles, and averaging said sample points of said composite signal based at least in part on said predetermined number of consecutive periodic signal cycles;
    wherein said solid state circuitry is operative so that said predetermined number of consecutive cycles sampled increases with a decrease in signal amplitude of said at least one initial signal output.

2. The metering apparatus of claim 1, wherein:
    said at least one sensor includes at least one current sensor for sensing current and providing at least one current signal output, and at least one voltage sensor for sensing voltage and providing at least one voltage signal output; and
    said solid state circuitry is operative for receiving a selected at least one output signal of said current signal and voltage signal outputs, sampling such selected at least one output signal at different respective points of a predetermined number of consecutive periodic signal cycles thereof, and summing such respective point samples to produce said composite signal with reduced low-frequency random noise relative to said selected at least one output signal.

3. The metering apparatus of claim 2, wherein said at least one current sensor and said at least one voltage sensor are respectively plural, and configured for use in multi phase systems, for outputting multiple current signal outputs and multiple voltage signal outputs therefrom, respectively.

4. The metering apparatus of claim 2, wherein said solid state circuitry is operative for synchronously sampling said at least one current signal output at different respective points of consecutive periodic signal cycles thereof.

5. The metering apparatus of claim 1, wherein:
    said at least one sensor comprises Hall effect sensors in an electricity meter for sensing at least one of current and voltage signals, and providing at least one initial signal output; and
    said solid state circuitry includes a metrology board for receiving said at least one initial signal output of said Hall effect sensors, sampling said at least one initial signal output at different respective points of a predetermined number of consecutive periodic signal cycles thereof, and summing such respective point samples to produce said composite signal with reduced low-frequency random noise relative to said at least one initial signal output.

6. The metering apparatus of claim 5, wherein said Hall effect sensors are configured for use in multi phase systems, for outputting multiple initial signal outputs therefrom, respectively.

7. The metering apparatus of claim 5, wherein said Hall effect sensors are operative for sensing current signals, and said solid state circuitry is operative for synchronously sampling said sensed current signals at different respective points of consecutive periodic signal cycles thereof.

8. The metering apparatus of claim 1, wherein said at least one sensor is configured for monitoring the consumption or production of a variety of forms of energy.

9. The metering apparatus of claim 8, wherein said forms of energy include at least one of electricity, gas, and oil.

10. An electricity meter with improved filtering of random noise, comprising:
    Hall effect sensors for sensing at least one of current and voltage signals, and providing at least one initial signal output;

a metrology board for receiving said at least one initial signal output of said Hall effect sensors, synchronously sampling said at least one initial signal output at different respective points of a predetermined number of consecutive periodic signal cycles thereof such that the frequency of said respective points per cycle is a constant integer multiple of the frequency of the at least one initial signal output, summing such respective point samples to produce a composite signal, said composite signal comprising sample points corresponding in value to summed values of matching respective point samples of said predetermined number of consecutive periodic signal cycles, and averaging said sample points of said composite signal based at least in part on said predetermined number of consecutive periodic signal cycles;

wherein said metrology board is operative so that said predetermined number of consecutive cycles sampled increases with a decrease in signal amplitude of said at least one initial signal output.

11. The electricity meter of claim 10, wherein said metrology board includes a buffer for storing said respective point samples of said predetermined number of consecutive cycles sampled from said at least one initial signal output.

12. The electricity meter of claim 10, wherein said Hall effect sensors are configured for use in multi phase systems, for outputting multiple initial signal outputs therefrom, respectively.

13. An electronic electricity meter, comprising:

input circuitry for receiving from a supply source electrical service signals to be metered, including current acquisition circuitry for outputting electrical service current signals therefrom, and voltage acquisition circuitry for outputting electrical service voltage signals therefrom; and a metrology board for receiving said electrical service voltage signals and said electrical service current signals, synchronously sampling said signals at different respective points of a predetermined number of consecutive periodic signal cycles thereof such that the frequency of said respective points per cycle is a constant integer multiple of the frequency of said signals, summing such respective point samples to produce a composite signal, and performing Root Mean Square (RMS) calculations based on such composite signal, with said predetermined number of consecutive periodic signal cycles being inversely related to the amplitude of said signals such that the predetermined number of consecutive cycles sampled increases with a decrease in signal amplitude of said signals, and with such corrected signals having reduced random noise relative to said electrical service signals.

14. The electronic electricity meter of claim 13, wherein said current acquisition circuitry and voltage acquisition circuitry are configured for use in multi phase systems, for outputting multiple electrical service current signals and multiple electrical service voltage signals therefrom, respectively.

15. The electronic electricity meter of claim 13, wherein said metrology board includes a buffer for storing said respective point samples of said predetermined number of consecutive cycles sampled from said signals.

16. The electronic electricity meter of claim 13 wherein said predetermined number of consecutive periodic signal cycles is at least three, and the number of different respective points synchronously sampled per cycle is at least sixteen.

17. The electronic electricity meter of claim 13, wherein said metrology board is operative for synchronously sampling said electrical service current signals at different respective points of a predetermined number of consecutive periodic signal cycles thereof, and averaging such respective point samples to produce corrected current signals on which RMS calculations are based.

18. The electronic electricity meter of claim 13, further comprising a frequency locked loop (FLL) locked to the voltage waveform of the supply source in which said electricity meter is installed, for determining said line frequency thereof for determining the sampling frequency of said respective points per signal cycle.

19. A methodology for signal filtering to remove the effects of a noise signal from a signal of interest, said methodology comprising:

synchronously sampling a signal waveform of an initial signal of interest at different respective points of a predetermined number of consecutive periodic noise signal cycles such that the frequency of said respective points per cycle is a constant integer multiple of the frequency of said signal waveform;

summing such respective point samples to produce a composite signal, said composite signal comprising sample points corresponding in value to summed values of matching respective point samples of said predetermined number of consecutive periodic signal cycles; and averaging the composite sample points based at least in part on the predetermined number of consecutive periodic signal cycles;

wherein the number of consecutive cycles in which respective samples are taken and averaged is predetermined, the predetermined number of consecutive cycles in which respective samples are taken being inversely related to the amplitude of the initial signal of interest such that as such signal amplitude level decreases, the number of cycles examined increases.

20. The methodology of claim 19, wherein the initial signal of interest is the output of Hall effect sensors in an electrical metrology environment.

21. The methodology of claim 20, wherein:

said Hall effect sensors are operative in an electricity meter; and said methodology further includes using such composite signal for RMS calculations.

22. The methodology of claim 19, wherein:

the initial signal of interest is an internal signal in a metrology environment; and said methodology further comprises processing the composite signal so as to evaluate waveform characteristics thereof with random noise reduced therefrom by such signal filtering.

23. The methodology of claim 22, wherein the metrology environment includes the monitoring of the consumption or production of a variety of forms of energy.

24. The methodology as in of claim 23, wherein said forms of energy include at least one of electricity, gas, and oil.

* * * * *